(12) United States Patent
Schueller et al.

(10) Patent No.: US 11,699,893 B2
(45) Date of Patent: Jul. 11, 2023

(54) VCSELS FOR HIGH CURRENT LOW PULSE WIDTH APPLICATIONS

(71) Applicant: Vixar, Inc., Plymouth, MN (US)

(72) Inventors: Randolph Schueller, Minneapolis, MN (US); Sara Rothwell, Minneapolis, MN (US)

(73) Assignee: Vixar, Inc., Plymouth, MN (US)

( * ) Notice: Subject to any disclaimer, the term of this patent is extended or adjusted under 35 U.S.C. 154(b) by 190 days.

(21) Appl. No.: 17/102,497

(22) Filed: Nov. 24, 2020

(65) Prior Publication Data

US 2022/0166192 A1 May 26, 2022

(51) Int. Cl.
*H01S 5/183* (2006.01)
*H01S 5/42* (2006.01)

(52) U.S. Cl.
CPC ...... *H01S 5/18311* (2013.01); *H01S 5/18338* (2013.01); *H01S 5/18394* (2013.01); *H01S 5/423* (2013.01)

(58) Field of Classification Search
CPC ............. H01S 5/18311; H01S 5/18338; H01S 5/18394; H01S 5/423
See application file for complete search history.

(56) References Cited

U.S. PATENT DOCUMENTS

| | | | |
|---|---|---|---|
| 7,801,197 B2 | 9/2010 | Konttinen | |
| 9,088,134 B2* | 7/2015 | Hibbs-Brenner | ... H01S 5/34326 |
| 10,181,701 B2 | 1/2019 | Moench et al. | |
| 2002/0163947 A1 | 11/2002 | Ostergaard et al. | |
| 2007/0217472 A1 | 9/2007 | Collins et al. | |
| 2008/0008219 A1 | 1/2008 | Mochizuki | |
| 2008/0151961 A1 | 6/2008 | Kim et al. | |
| 2011/0027925 A1* | 2/2011 | Ikuta | ... H01S 5/18311 372/45.01 |
| 2017/0070029 A1* | 3/2017 | Moeneclaey | ... H01S 5/183 |
| 2020/0244036 A1 | 7/2020 | Forman et al. | |

FOREIGN PATENT DOCUMENTS

| | | | | |
|---|---|---|---|---|
| JP | 2005045107 A | * | 2/2005 | ... H01S 5/042 |
| WO | 2004036707 A2 | | 4/2004 | |

OTHER PUBLICATIONS

Machine translation of JP2005-45107A (Year: 2005).*
International Search Report and Written Opinion for PCT/US2021/060772; dated Mar. 25, 2022; 12 pages.

* cited by examiner

*Primary Examiner* — Yuanda Zhang
(74) *Attorney, Agent, or Firm* — Viering, Jentschura & Partner MBB

(57) ABSTRACT

Systems and methods disclosed herein include a vertical cavity surface emitting laser (VCSEL) device that includes an anode, a cathode, and one or more curved apertures located in an epitaxial layer between the anode and the cathode, each of the one or more curved apertures having an aperture edge and one or more oxidation bridges crossing the curved aperture that allow current to flow inside the curved aperture, in which when a current signal is applied to the VCSEL, current flow between the anode and the cathode is distributed along the aperture edge of the one or more curved apertures.

17 Claims, 15 Drawing Sheets

VCSELS FOR HIGH CURRENT LOW PULSE WIDTH APPLICATIONS

FIELD OF THE DISCLOSURE

This disclosure relates to vertical cavity surface emitting lasers (VCSELs), and specifically to systems and methods for designing VCSEL apertures for high current, low pulse width applications.

BACKGROUND

VCSELs and VCSEL arrays are important technologies for applications within a variety of markets, including but not limited to, the consumer, industrial, automotive, and medical industries. Example applications include, but are not limited to, illumination for LiDAR (Light Detection and Ranging), security cameras, illumination for sensors such as three-dimensional (3D) cameras or gesture recognition systems, medical imaging systems, light therapy systems, or medical sensing systems such as those requiring deep penetration into tissue. In such optical sensing and illumination applications as well as other applications, VCSELs and VCSEL arrays offer several benefits, as will be described in further detail herein, including but not limited to, power efficiency, narrow spectral width, narrow beam divergence, and significant packaging flexibility.

Indeed, for VCSELs and VCSEL arrays, power conversion efficiency (PCE) of greater than 30% can be achieved at wavelengths in the 660-1000 nanometer (nm) range. PCE may be defined as the ratio of optical power emitted from one or more lasers, such as a VCSEL or VCSEL array, divided by the electrical power used to drive the laser(s). While VCSEL PCE, alone, is fairly comparable to that for some of the most efficient light-emitting diodes (LEDs) currently available, when spectral width and beam divergence are considered, there are significant efficiency benefits to VCSELs over LEDs.

For example, VCSEL arrays generally have a spectral width of approximately 1 nm. This allows the use of filters for a photodetector or camera in order to reduce the noise associated with background radiation. For comparison, an LED typically has a spectral linewidth of 20-50 nm, resulting in the rejection of much of the light by such a filter, and hence reducing the effective PCE of the LED. In addition, the wavelength of a VCSEL is less sensitive to temperature, increasing only around 0.06 nm per 1° Celsius increase in temperature. The VCSEL rate of wavelength shift with temperature is four times less than in a LED.

The vertically emitting nature of a VCSEL also gives it much more packaging flexibility than a conventional laser, and opens up the door to the use of the wide range of packages available for LEDs or semiconductor integrated circuits (ICs). In addition to integrating multiple VCSELs on the same chip, as will be described in further detail below, one can package VCSELs or VCSEL arrays with photodetectors or optical elements. Plastic or ceramic surface mount packaging or chip-on-board options are also available to the VCSEL.

VCSEL geometry traditionally limits the amount of optical power an individual VCSEL can provide. To illustrate the issue, FIG. 1 is a diagram of the cross-section of a typical VCSEL 100, and includes general structural elements and components that may be utilized, as an example, for VCSEL and VCSEL array implementations disclosed herein. In general, epitaxial layers of a VCSEL may typically be formed on a substrate material, such as a GaAs substrate. On the substrate, single crystal quarter wavelength thick semiconductor layers may be grown to form mirrors (e.g., n- and p-distributed Bragg reflectors (DBRs)) around a quantum well based active region to create a laser cavity in the vertical direction. For example, on the substrate, first mirror layers may be grown, such as but not limited to layers forming an AlGaAs n-DBR, where the n-designates n-type doping. A spacer, such as but not limited to an AlGaInP spacer for wavelengths below 720 nm, or AlGaAs for wavelengths above 720 nm, may be formed over the first mirror layers. Then a quantum well based active region, such as but not limited to an AlGaInP/GaInP multiple quantum well (MQW) active region for wavelengths less than 720 nm may be formed, along with another spacer layer, such as but not limited to an AlGaInP spacer. Over that, second mirror layers may be grown, such as but not limited to layers forming an AlGaAs p-DBR, where the p- designates p-type doping, over which a current spreader/cap layer may be formed, such as but not limited to, an AlGaAs/GaAs current spreader/cap layer. For wavelengths above 720 nm, the spacer layer may be AlGaAs or GaAs. Active regions may include AlGaAs/AlGaAs for wavelengths from 720 nm up to 820 nm, or AlGaAs/GaAs for wavelengths from 800 nm to 870 nm, or AlGaAs/InGaAs for wavelengths above 870 nm. A contacting metal layer may be formed over the cap layer, leaving an aperture, typically with a round shape, of desired diameter generally centered over the axis of the VCSEL. In some implementations, a dielectric cap may be formed within the aperture. The VCSEL structure could also be grown with the p-type DBR grown first on the GaAs substrate, followed by the active layer, and then an n-type DBR. Alternatively, both mirrors could be n-type, or both mirrors could be grown p-type, with one or more tunnel junctions incorporated into the structure.

As will be explained in more detail below with specific reference to certain implementations of the present disclosure, a mesa, typically with a round shape, may be formed by etching down through the epitaxial structure of the VCSEL to expose a higher aluminum containing layer or layers for oxidation. The oxidation process leaves an electrically conductive approximately round aperture in the oxidized layer or layers that is generally aligned with the aperture defined by the contacting metal layer, providing confinement of current to the middle of the VCSEL. More generally, unless specifically or expressly described otherwise, any VCSEL now known or later developed may be suitable for various embodiments of the present disclosure or suitably modifiable according to the present disclosure.

For efficient operation of a VCSEL, a method for providing current confinement in the lateral direction (achieved with the electrically insulating oxidation layer shown) to force current flow through the center of the device is often required. The metal contact on the surface of the device may provide a means for injecting current into the VCSEL. As described above, the metal contact should have an opening or aperture in order to allow the light to leave the VCSEL. There is a limit to how far current can be spread efficiently across this aperture, and hence there is a limit to the lateral extent of the laser, and in turn, the maximum power that can be emitted from a single round aperture. One solution to this, for applications requiring more power, is to create an array of VCSELs on a chip. In such an approach, the total output power can be scaled simply by scaling the number of VCSEL devices or apertures. These VCSELs are typically arranged in a square, rectangular, or hexagonal grid, although other, less regular arrangements can be used. FIG. 2A illustrates an example layout for a VCSEL die or chip 200 with, for example, one hundred and eleven (111) VCSEL devices/apertures. A common metal layer on the top surface of the chip (or similar contact mechanism) may contact the anode of each VCSEL device simultaneously, and a common cathode contact (or similar contact mechanism) may be made on the backside of the chip, allowing all the VCSEL devices to be driven in parallel.

An array approach not only solves the technical issue of emitting more optical power, but also provides important advantages. For example, a conventional single coherent laser source results in speckle, which adds noise. However, speckle contrast can be reduced through the use of an array of lasers which are mutually incoherent with each other. Another advantage or benefit is that of improved eye safety. An extended source is generally more eye safe than a point source emitting the same amount of power. Still another advantage or benefit is the ability to better manage thermal heat dissipation by spreading the emission area over a larger substrate area.

Requirements for an optical source typically depend upon the application and the sensing mechanism used. For example, illumination for night vision cameras may involve simply turning on the light source to form constant uniform illumination over a wide angle which is reflected back to the camera. However, additional illumination schemes can provide more information, including but not limited to, three-dimensional (3D) information. For instance, mechanism such as structured lighting or time-of-flight, can be used to gather information in three dimensions.

Typically, requirements of an optical light source for any given application may include consideration of one or more of the following:

1. Optical output power: Sufficient power is required for illumination of the area of interest. This can range from tens of milliwatts of optical power, such as for a sensing range of a generally a few centimeters, to hundreds of milliwatts, such as for games or sensing of generally a meter or two or so, to ten watts, such as for collision avoidance systems, and kilowatts of total power, such as for LiDAR for a self-driving car.
2. Power efficiency: Particularly for mobile consumer devices, a high efficiency in converting electrical to optical power is desirable and advantageous.
3. Wavelength: For many applications, including most consumer, security, and automotive applications, it may be preferable that the illumination be unobtrusive to the human eye, and often in the infrared region. On the other hand, low cost silicon photodetectors or cameras limit the wavelength on the long end of the spectrum. For such applications, a desirable range therefore, may be generally around or between 800-1000 nm. However, some industrial applications may prefer a visible source for the purpose of aligning a sensor, and some medical applications may rely on absorption spectra of tissue, or materials with sensitivity in the visible regime, primarily around 650-700 nm.
4. Spectral width and stability: The presence of background radiation, such as sunlight, can degrade the signal-to-noise ratio of a sensor or camera. This can be compensated with a spectral filter on the detector or camera, but implementing this without a loss of efficiency often requires a light source with a narrow and stable spectrum.
5. Modulation rate or pulse width: For sensors based, for example, upon time of flight or a modulation phase shift, the achievable pulse width or modulation rate of the optical source can determine the spatial resolution in the third dimension.
6. Beam divergence: A wide variety of beam divergences might be specified, depending upon whether the sensor is targeting a particular spot or direction, or a relatively larger area.
7. Packaging: The package provides the electrical and optical interface to the optical source. It may incorporate an optical element that helps to control the beam profile and may generate a structured lighting pattern. Particularly for mobile devices or other small devices, the overall packaging would desirably be as compact as possible. Surface mount packages, compatible with standard board assembly techniques are almost always preferred over through hole packages such as TO headers.

Some newer applications for VCSELs, such as LiDAR, may require short pulses (e.g. 1-100 nanosecond (ns) pulse widths) with high current to achieve short, high power pulses of light from a small area. It is known that operating VCSELs at high current densities can result in a reduction of VCSEL lifetime. Therefore, what is needed in the art are strategies for VCSEL design that reduce the impact of very high current, short pulse width operation.

SUMMARY

Various implementations disclosed herein include a vertical cavity surface emitting laser (VCSEL) device that includes an anode, a cathode, and one or more curved apertures located in an epitaxial layer between the anode and the cathode, each of the one or more curved apertures having an aperture edge and one or more oxidation bridges crossing the curved aperture that allow current to flow inside the curved aperture, in which when a current signal is applied to the VCSEL, current flow between the anode and the cathode is distributed along the aperture edge of the one or more curved apertures In some implementations, the one or more curved apertures are ring shaped. In some implementations, the one or more curved apertures comprise two or more concentric rings. In some implementations, the device further includes a circular aperture inside the one or more curved apertures. In some implementations, an edge of the anode overlaps with the aperture edge of the one or more curved apertures.

In some implementations, the one or more curved apertures are partial arc lengths of a two-dimensional conic section. In some implementations, a center line of the one or more curved apertures deviates by at least 30% from a tangent line placed at an end point of the center line. In some implementations a curved area of the one or more curved apertures deviates by at least 30% from a linear aperture having a same area and center point. In some implementations, the one or more curved apertures has a curvature above a threshold such that the curvature affects a far-field light output of the VCSEL device via mode selection.

In some implementations, the one or more curved apertures are defined by an oxide layer in the epitaxial layer. In some implementations, the one or more curved apertures are fabricated by ion implantation in the epitaxial layer. In some implementations, the current signal is a high current, low pulse width current. In some implementations, the current signal is at least 50 milli-Amps and has a pulse width less than 100 nanoseconds.

Further implementations disclosed herein include a vertical cavity surface emitting laser (VCSEL) array. The array includes a plurality of VCSELs arranged in a two-dimension array,
wherein each of the plurality of VCSELs is as described above.

These and other features of the present implementations will be understood better by reading the following detailed description, taken together with the figures herein described. The accompanying drawings are not intended to be drawn to scale. For purposes of clarity, not every component may be labeled in every drawing.

DETAILED DESCRIPTION

Figure 1:
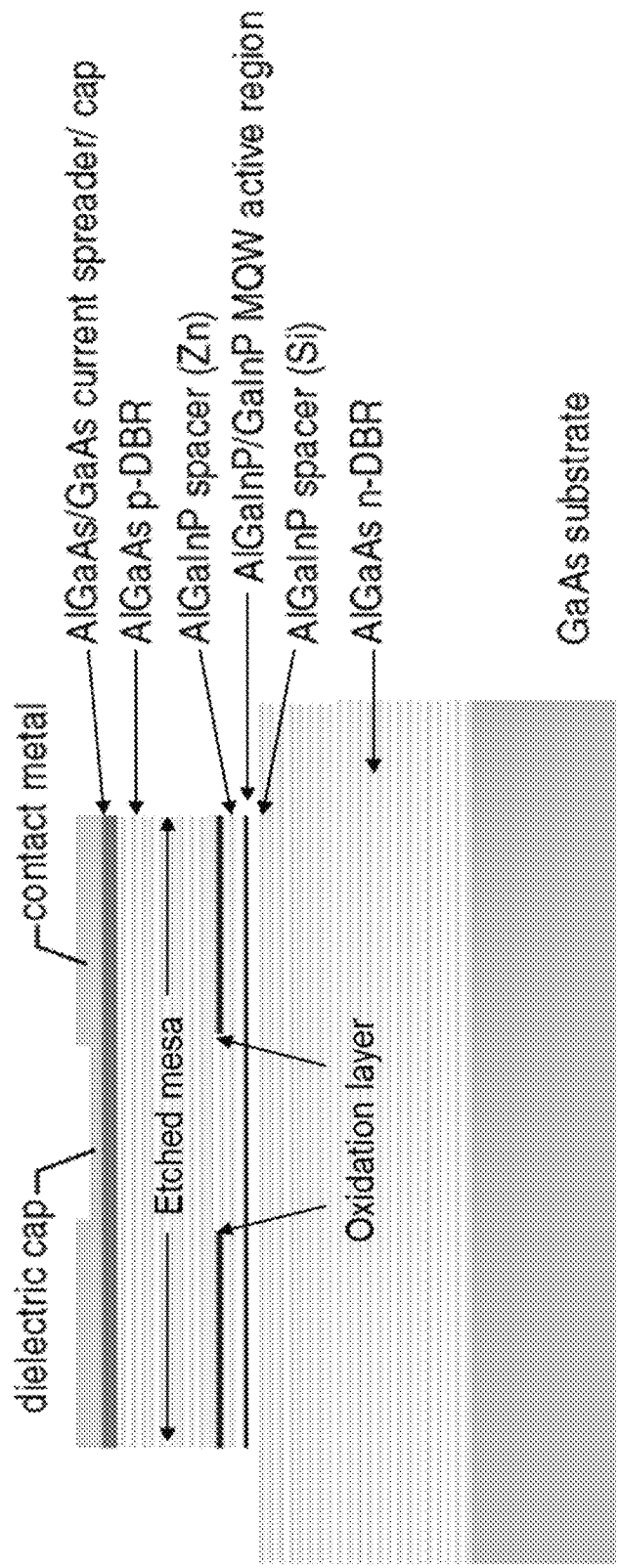
FIG. 1 is a cross sectional diagram of the structure of a prior art VCSEL.
Figure 2A:
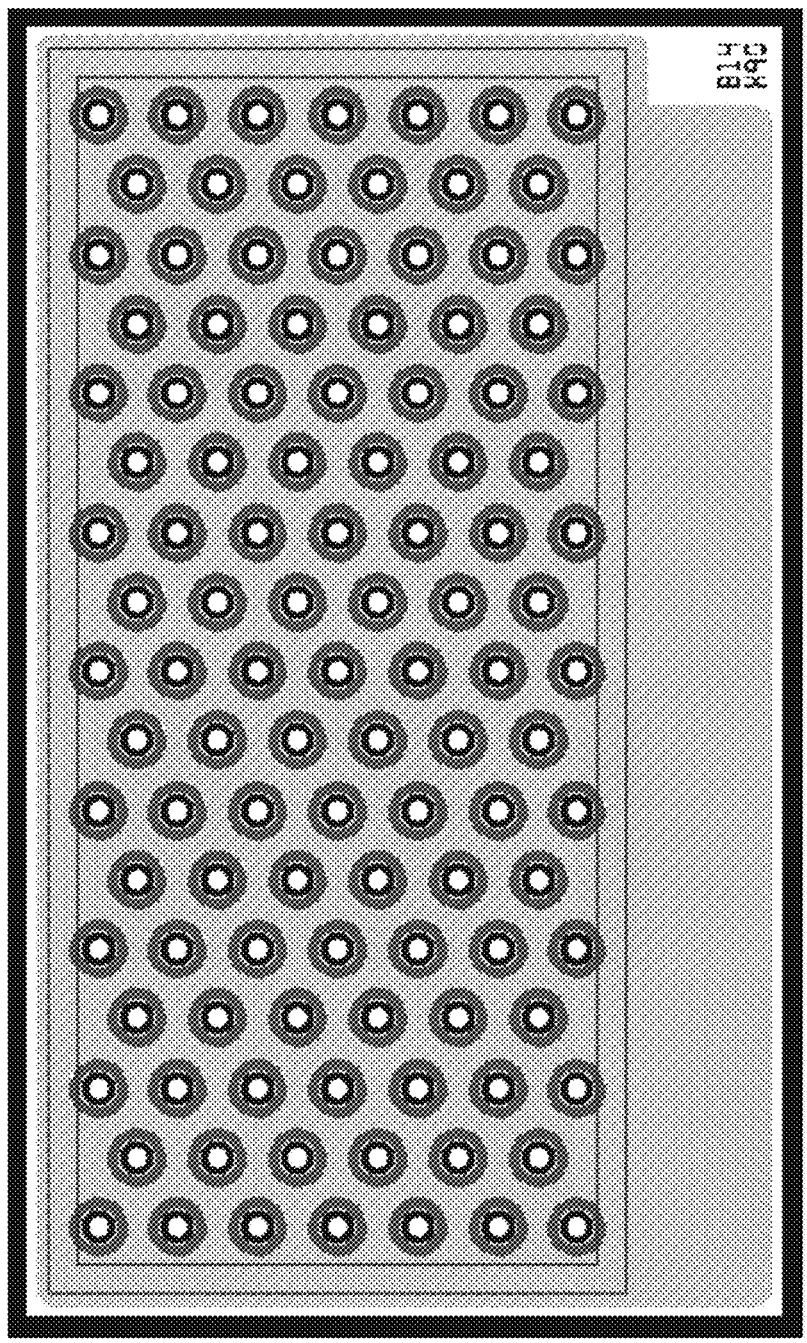
FIGS. 2A-C are diagrams illustrating prior art VCSEL chip designs incorporating circular VCSEL apertures.
Figures 2B, 2C:
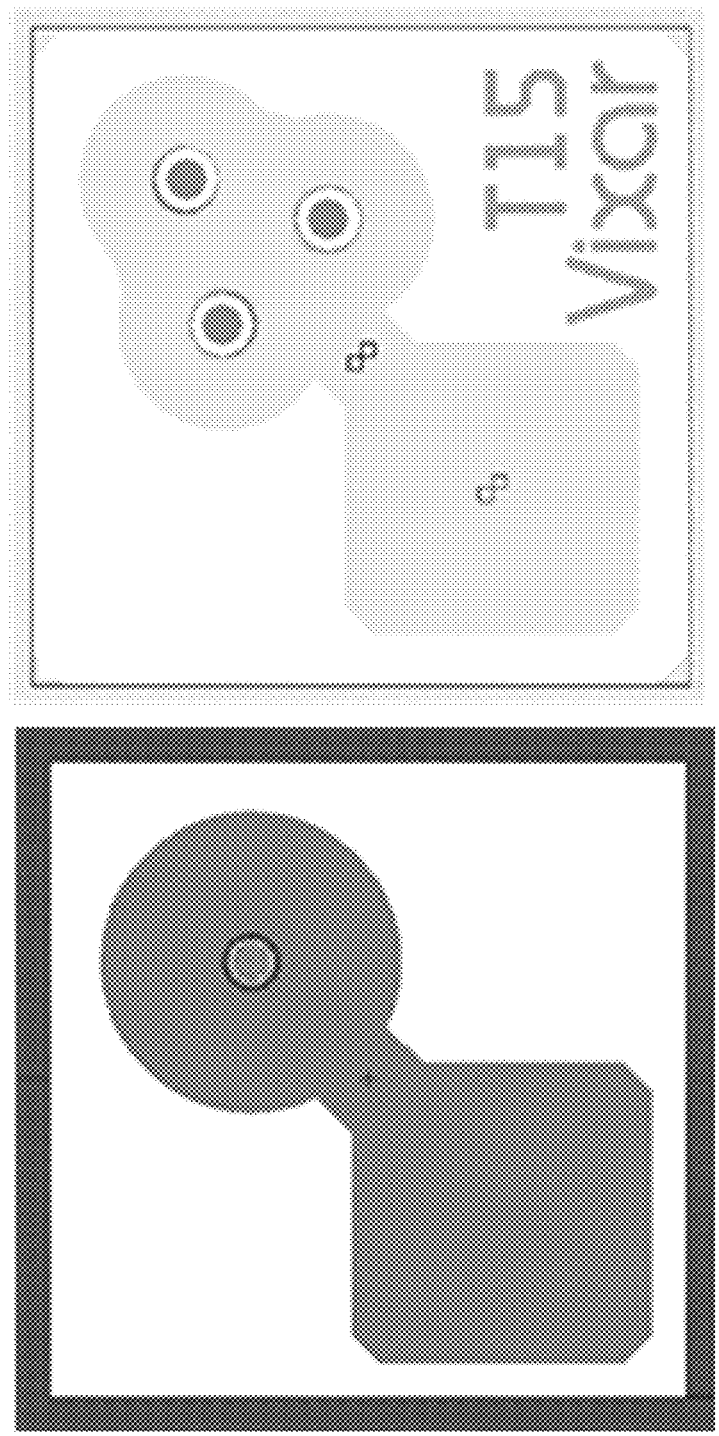
Figure 3:
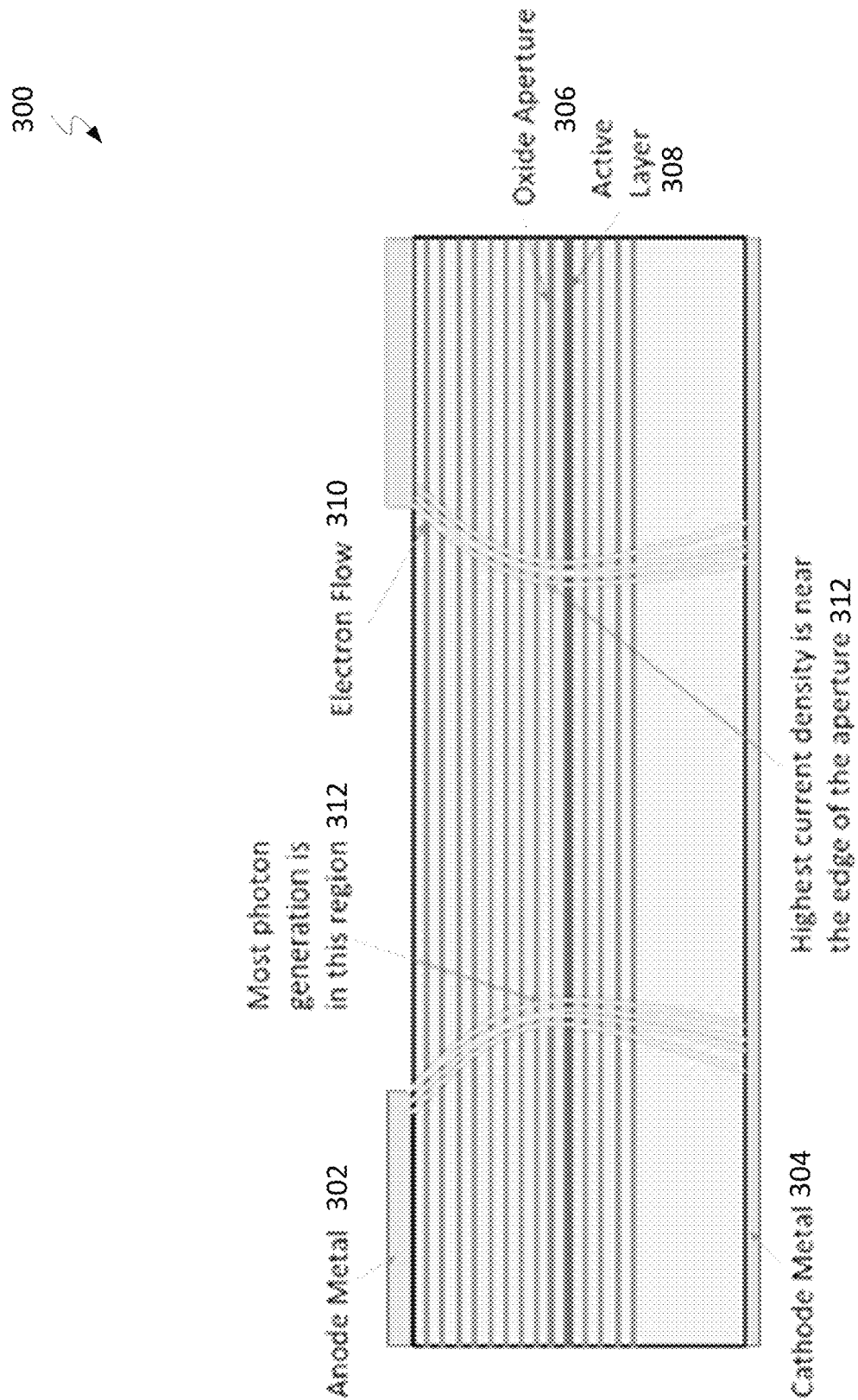
FIG. 3 is a profile view of a prior art VCSEL having a circular aperture operating under high current, low pulse width conditions, illustrating the path of current flow.

FIGS. 2A-C includes diagrams of different VCSEL die layouts with varying numbers of VCSEL apertures. FIG. 2A shows a chip 200 designed for light emission in the range of watts, and including 111 circular VCSEL apertures. FIG. 2B illustrates a chip design for a single circular aperture low power VCSEL, while FIG. 2C illustrates a VCSEL die with 3 circular apertures. FIG. 3 is a profile view of a VCSEL 300 having a circular aperture operating under high current, low pulse width conditions. FIG. 3 may be a profile view of one of the circular aperture VCSELs shown in FIGS. 2A-C. The VCSEL 300 includes an upper anode metal layer 302 and a lower cathode metal layer 304. In between the anode and cathode layers 302, 304 are the oxide aperture 306 and an active layer 308.

Current applied to the VCSEL 300 causes electron flow 310 between the anode and cathode contacts. When a current is applied to VCSEL 300, the electrons tend to flow the shortest path from anode to cathode. In some cases, the applied current may be a high current, low pulse width current, which may be defined as a current of at least 50 mA (assuming a VCSEL diameter in the range of 5-15 μm) and a pulse width below 100 ns. As can be seen from FIG. 3, this short electron flow 310 is an arc that passes by the aperture edges 312 around the whole circumference of the aperture 306. The electrons crowd around the aperture edges 312, meaning the aperture edges 312 experience the highest current density and the most photons are generated near the aperture edges 312. When high current is applied to the VCSEL 300 at short pulse widths, damage to the aperture region may occur. Specifically, heat-induced phase changes may occur in the distributed Bragg reflector (DBR) layers near the aperture edges 312. Alternatively, the temperature rise occurring at the areas of highest current density can accelerate the growth of defects that serve as non-radiative recombination centers.

Systems and methods disclosed herein avoid the heat damage issue, while simultaneously maintaining a high output power density and also providing a means for controlling the beam profile. Design considerations in developing the implementations disclosed herein include: a) maintaining the proper overlap of the metal and the oxide aperture, b) controlling current density, and (c) using aperture shapes that maintain a high output power density and help to control beam shape.

In referring to FIG. 3, one of the design parameters is the relative size of the anode metal contact opening compared to the oxide aperture diameter. Efficiency considerations suggest that keeping the metal opening larger than the oxide opening might be preferable, in order not to shadow or block any of the light being generated at the active region. However, this exacerbates the current crowding issue. Therefore, designing VCSELs to reduce current crowding might suggest that the metal aperture edge and oxide aperture edges are coincident, or even that the metal aperture overlaps the oxide aperture somewhat.

A second consideration is around current density. Typically, the "rule of thumb" for maintaining a high reliability device is to keep the current density (current per emitting area) below a certain value. For continuous operation (i.e. not pulsed), this is often below 10 kA/cm$^2$. However for pulsed operation with short pulses and low duty cycle, higher peak current densities can be used because the overall thermal load is less and there is less acceleration due to the junction temperature rise. According to some prior art documents, 100 kA/cm$^2$ is a good rule of thumb under these conditions. However, our observation is that a more appropriate rule of thumb would be the parameter "linear current density" (that is current divided by the length of the edge of the aperture) or current/cm. For a 10 μm aperture VCSEL, for instance, the continuous operation limit of 10 kA/cm$^2$ translates to 2.5 A/cm, while the 100 kA/cm$^2$ pulsed limit translates to 25 A/cm.

Given this, a design approach for high power would be to design an aperture that maximizes the linear edge of the aperture. For instance, one could achieve this by using ring-shaped apertures, or curved apertures in general, instead of circular apertures. Using ring or curved-shaped apertures increases the total length of the aperture edge, which reduces the concentration of current per unit length. This in turn reduces the heat generated at each point of the aperture edge, and thus reduces the danger of heat damage when the VCSEL is operated at high currents and low pulse widths. One could also choose a geometry of a long narrow rectangular aperture, which would similarly provide the ability to provide higher power with a reduced linear current density. The choice of shape depends upon the application.

Figure 4:
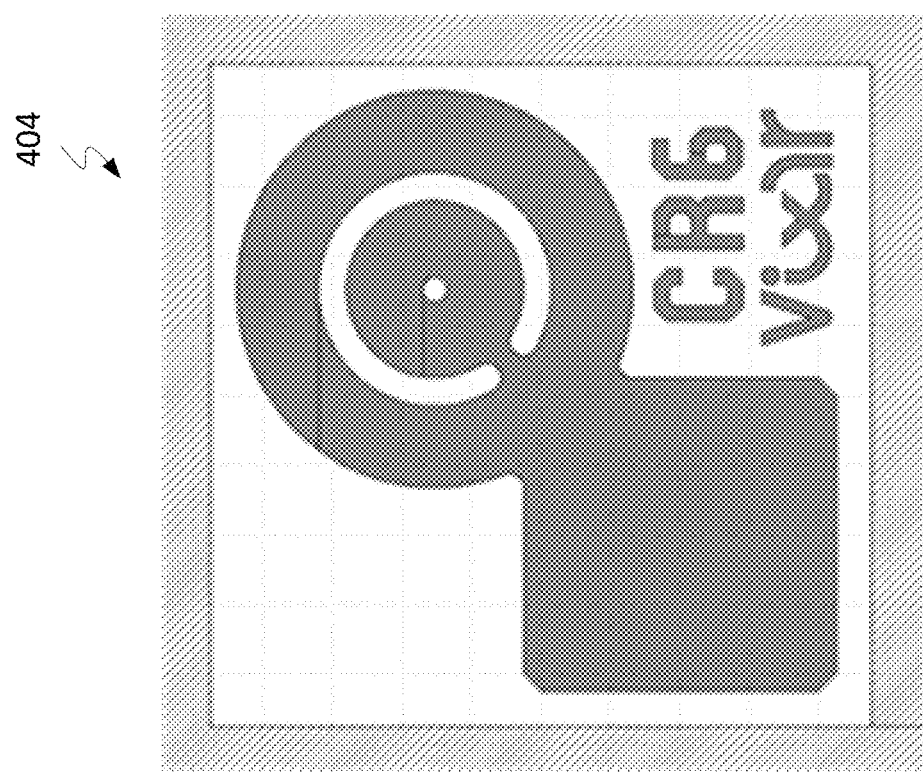
FIG. 4 are diagrams illustrating VCSELs having ring apertures in accordance with various implementations.
Figure 4:
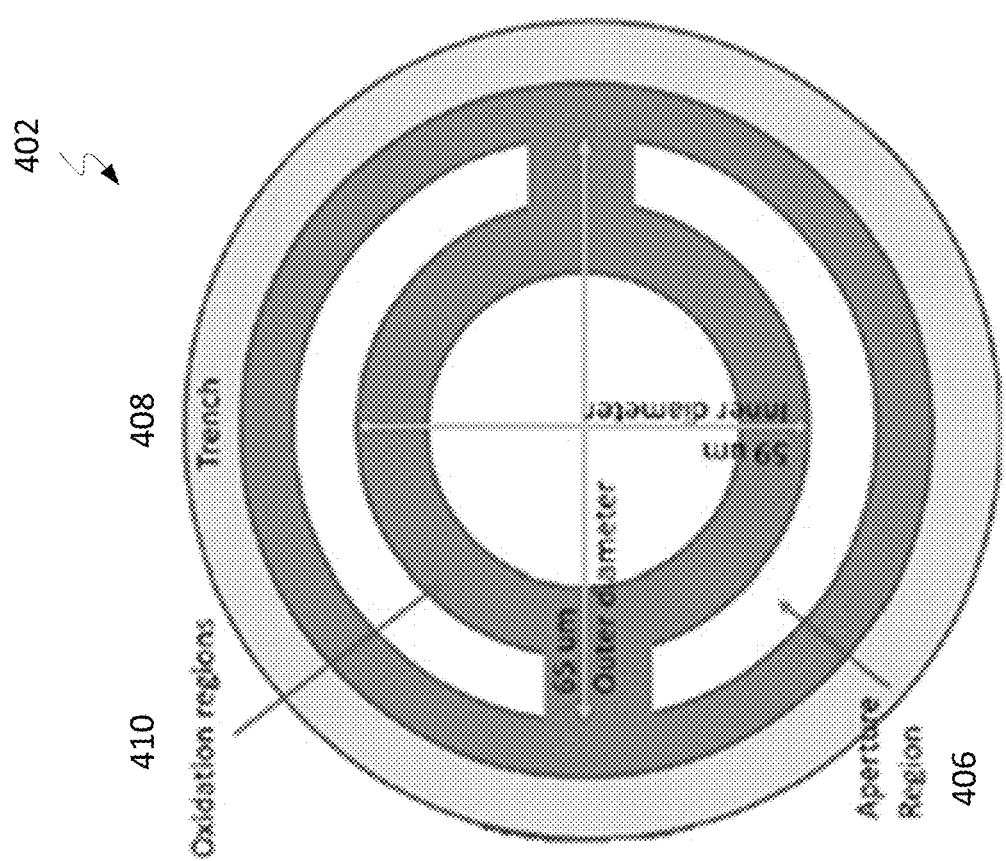

FIG. 4 includes diagrams 402, 404 illustrating VCSELs having ring apertures in accordance with various implementations. Diagram 402 shows a VCSEL with a ring-shaped aperture. As can be seen in diagram 402, there are multiple aperture regions 406, including an inner circular aperture region along with an outer ring aperture, with oxidation regions 410 separating the aperture regions 406. Particularly, there are two small oxidation "bridges" that interrupt the ring aperture and allows current to flow into the aperture. A trench 408 may surround the VCSEL. Diagram 404 shows a VCSEL aperture die with another ring-shaped aperture. In this case, the VCSEL includes an inner circular aperture and an outer ring-shaped aperture interrupted by an oxidation bridge.

The ring apertures shown in FIG. 4 provide a much longer aperture edge than circular apertures. For example, the length of the aperture edge for a circular aperture is just the circumference of the aperture. However, the length of the aperture edge for a ring is equal to the perimeter around the aperture regions, which may be approximately equal to the inner circumference of the ring plus the outer circumference of the ring adjusted by the perimeter of the end(s) of the rings. When current is applied to the VCSELs in FIG. 4, the electron flow is distributed evenly along the entire edge of the aperture, which means there is less current at each point of the aperture edge compared with a circular aperture and therefore less heat is generated per unit length of the aperture length. This means that VCSELs with ring-shaped apertures may operate under high current, low pulse width conditions without significant risk of heat damage.

For instance, let's compare FIG. 4 to FIG. 2C. In FIG. 2C, if one were to draw a circle encompassing all three apertures, with the perimeter touching the outmost edges of the three apertures, the diameter of that circle would be 65 microns. If the radius of each aperture was 15 microns, then the total perimeter of the three apertures would be 141.4 microns. On the other hand, if we examine diagram 402 of FIG. 4 and consider the ring with an outer diameter of 65 microns (so encompassing the same area on the die) and an inner diameter of 59 microns (for a width of 6 microns), then (neglecting the ends and the small gap) the perimeter would be approximately 390 microns. Thus, while maintaining the overall emission circle, but replacing the three VCSEL apertures with the ring, the linear current density could be reduced by a factor of 2.8.

Figure 5:
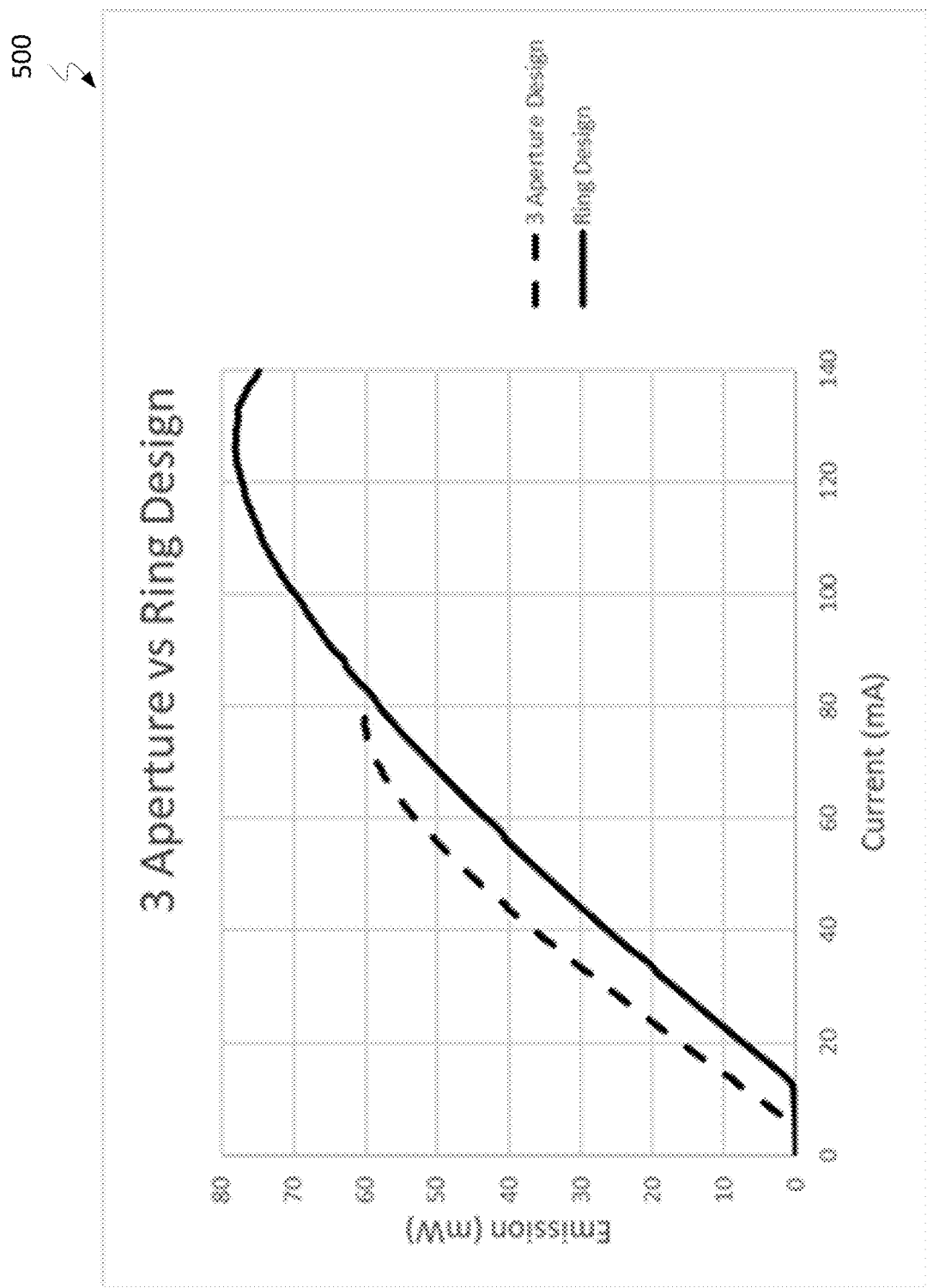
FIG. 5 illustrates a graph illustrating the output power versus input current for a three-ring aperture and a ring aperture in accordance with various implementations.

On the other hand, the emitting areas of the two designs are nearly the same. FIG. 5 illustrates a graph illustrating the output power versus input current for three round apertures and a ring aperture in accordance with various implementations. Even though the emitting areas of the two designs are approximately the same, the maximum output power is higher for the ring design than for the three-aperture design, indicating that the maximum power emitting is not strictly a function of emitting area, but is increased as a function of a larger linear edge.

Figure 6A:
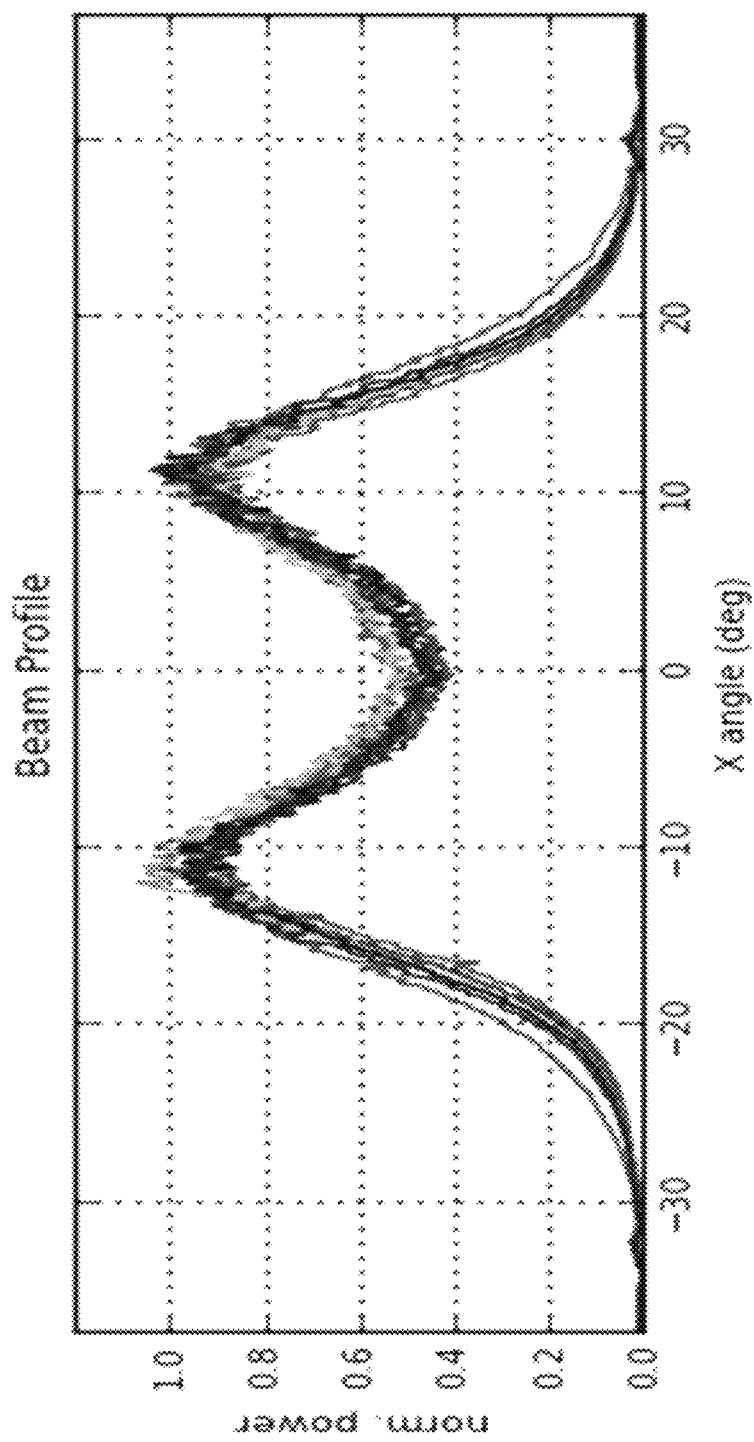
FIGS. 6A-D illustrate the beam divergence of different VCSEL aperture designs.
Figure 6B:
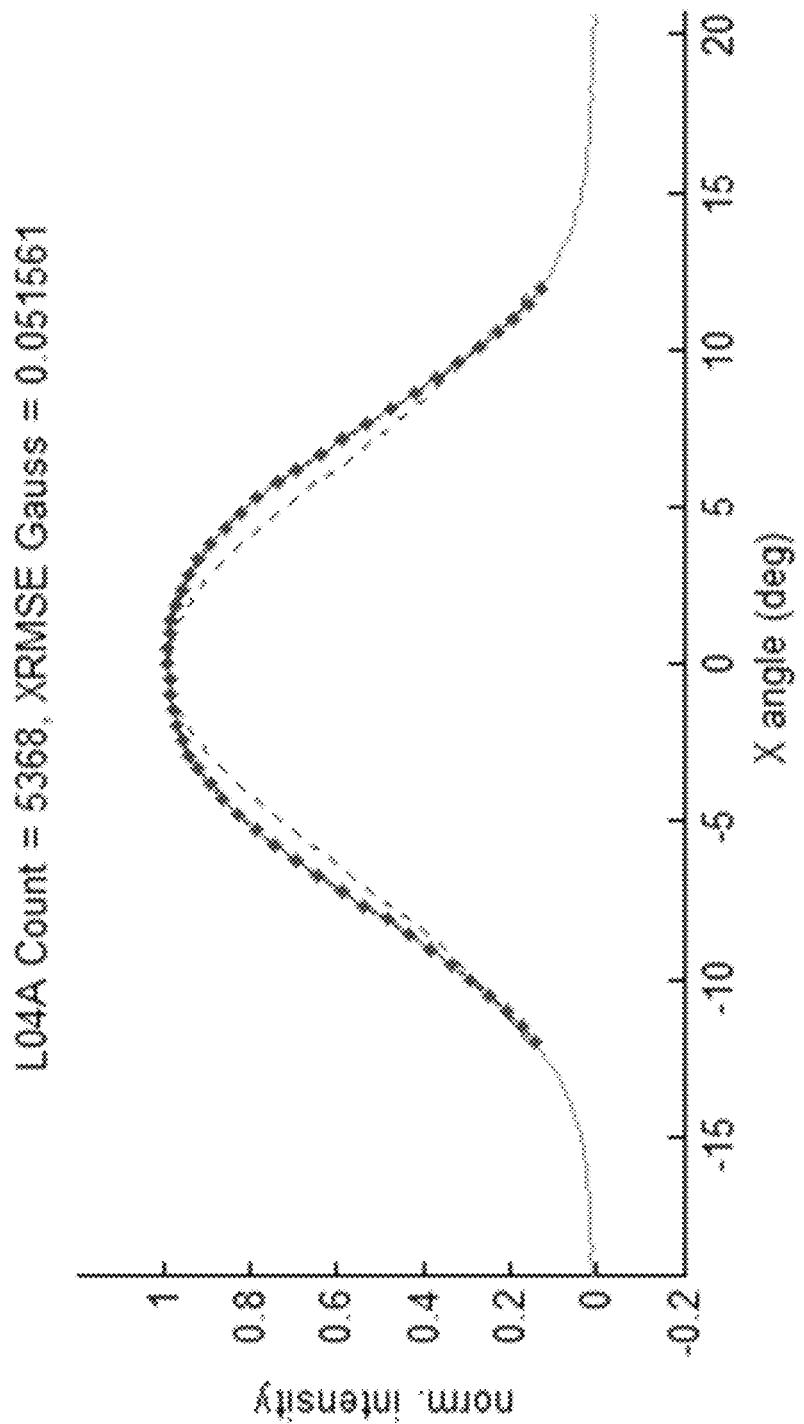
Figure 6C:
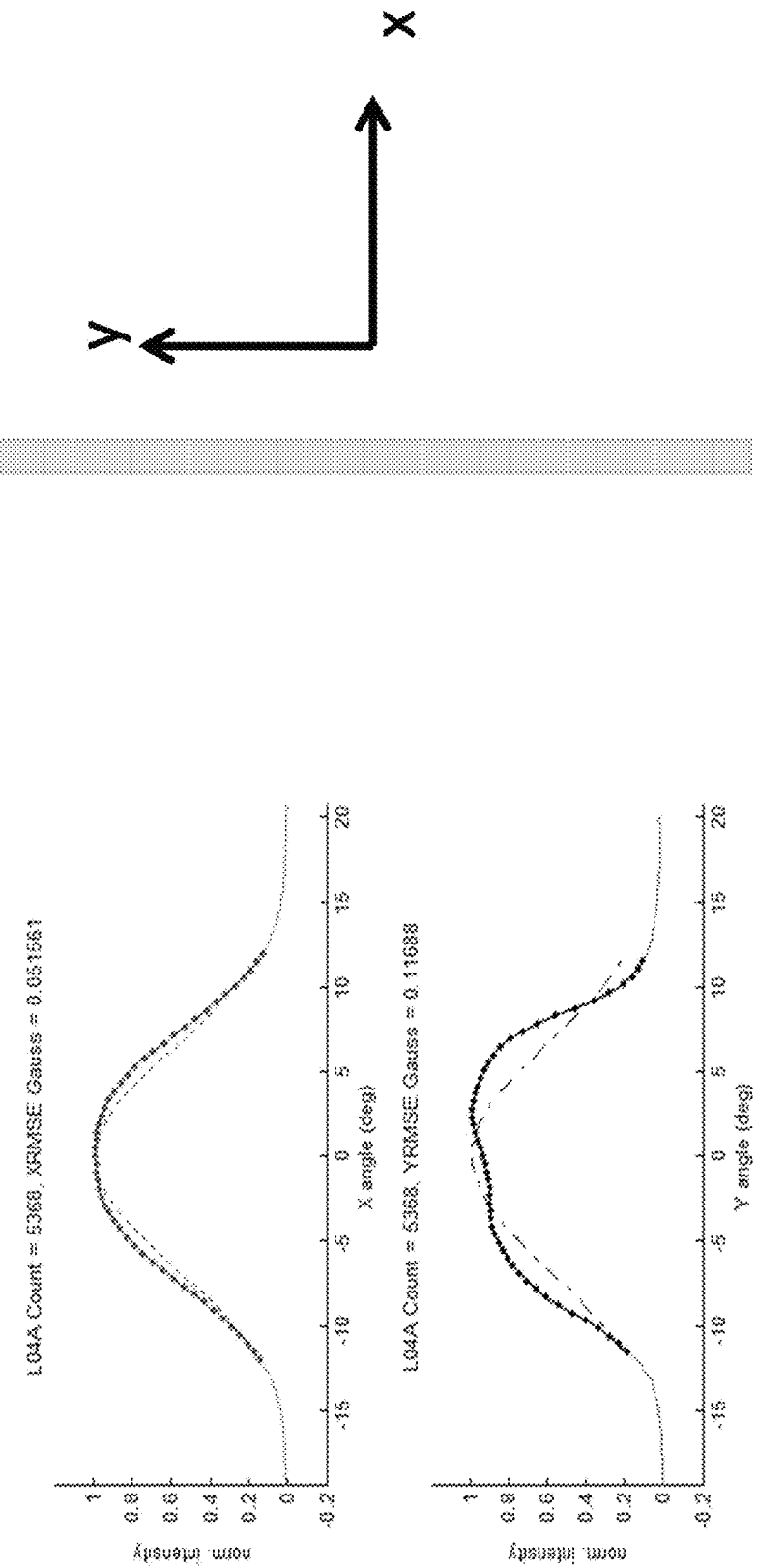
Figure 6D:
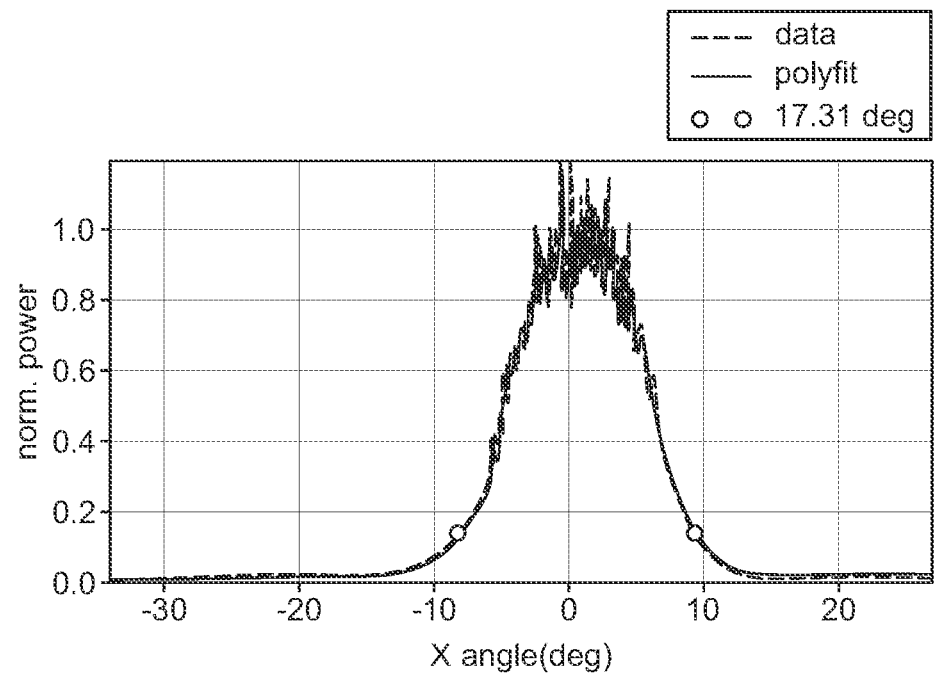
Figure 6D:
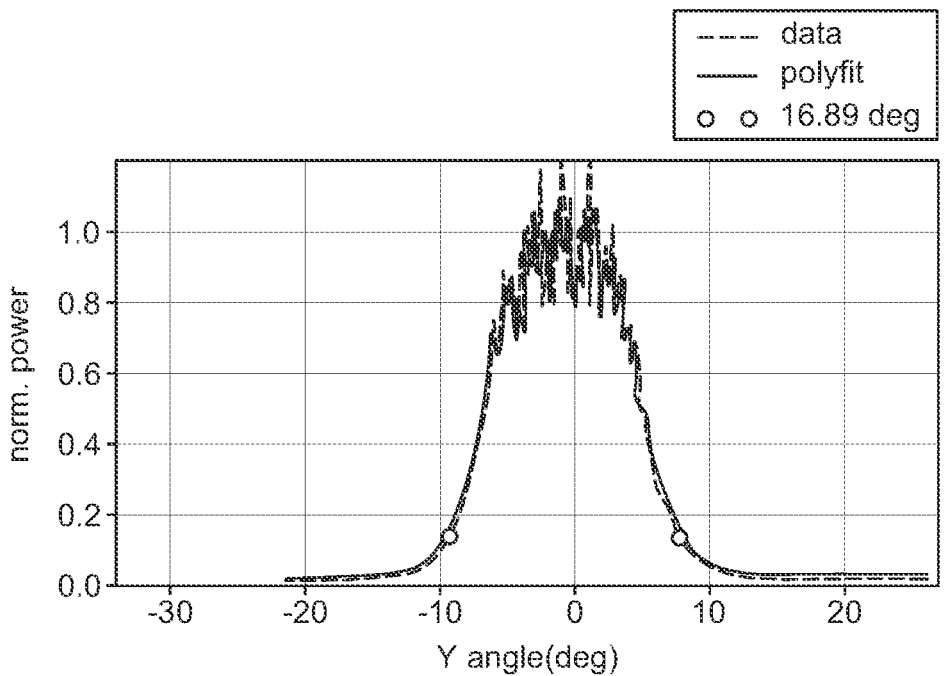

Another aspect of a ring or curved aperture design is the potential for controlling the beam shape. Normally one of the primary ways to control the beam shape of light emitted by a VCSEL is to control the size of the emitting aperture. FIG. 6A illustrates the beam shape of light emitted from a larger size round VCSEL. This is a one-dimensional profile of light intensity versus angle taken through a profile which is radially symmetric. Zero degrees is the direction perpendicular to the plane of the VCSEL die. The beam profile is referred to as "donut shaped" because the light intensity at zero degrees is lower than at a slightly larger angle. FIG. 6B illustrates the shape of the beam emitted from a smaller round aperture, usually with a diameter of 6 microns or less. In this case the shape is closer to Gaussian, with the peak intensity at zero degrees. FIG. 6C shows the beam shape of a long rectangular VCSEL. The beam shape is no longer radially symmetric. The one-dimensional profile across the direction parallel to the short side of the rectangle (top plot) appears Gaussian, while the beam profile in the long direction of the rectangle (bottom plot) is a flat top, with small dip in intensity close to zero degrees. Finally FIG. 6D illustrates the beam shape of one the VCSELs with the ring shaped apertures. A one-dimensional profile in two perpendicular directions shows that the beam shape is radially symmetric and Gaussian shaped in both directions.

Figure 7:
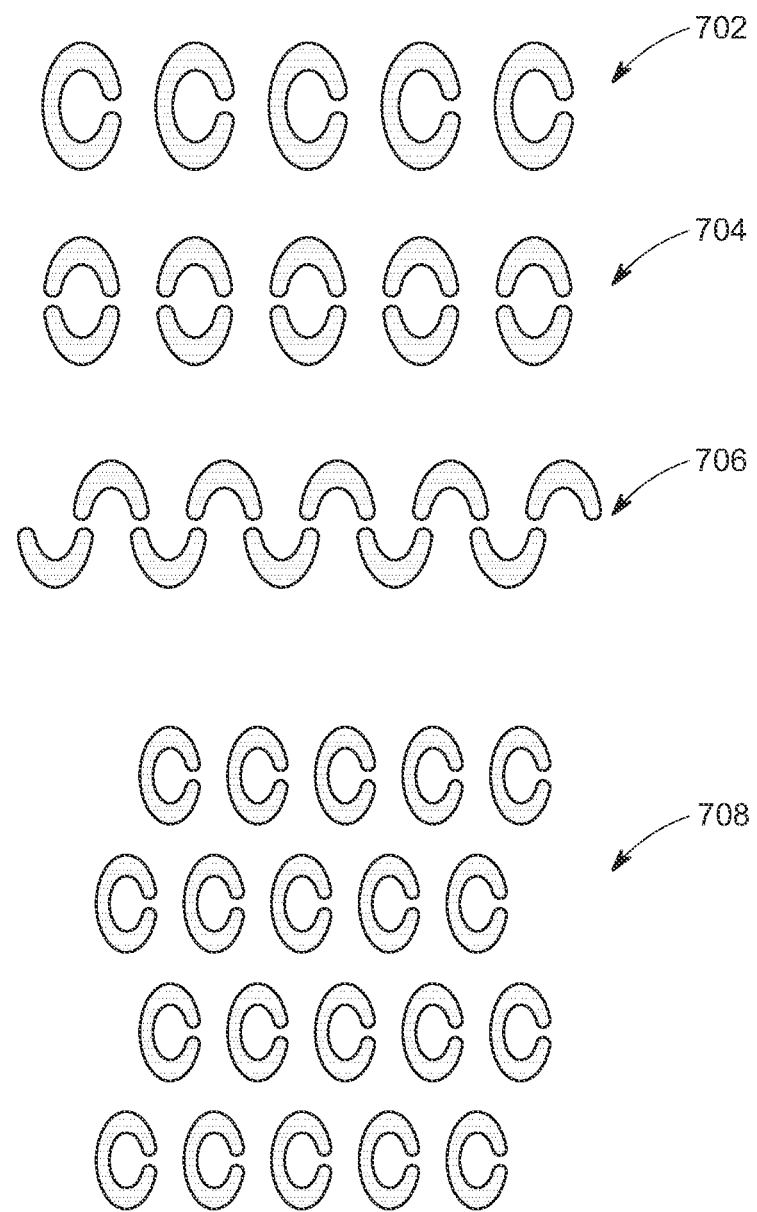
FIG. 7 are diagrams illustrating variations of ring apertures for VCSELs in accordance with various implementations.

For higher power output VCSEL die, arrays of ring VCSELs may be implemented. A further advantage of arrays of ring VCSELs may be that the individual ring segments are not coherent with each other, and therefore the superposition of the light from the VCSELs in the array result in less speckle. FIG. 7 includes diagrams illustrating variations of ring apertures for VCSELs in accordance with various implementations. For example, ring apertures 702 may be ring shaped with one small oxidation bridge crossing the ring. Ring apertures 704 may be ring shaped with two oxidation bridges crossing the ring, resulting in two half-ring apertures. Ring apertures 706 may be alternating half-ring apertures (e.g., top half followed by bottom half), with oxidation bridges separating each half-ring aperture. Array 708 shows an array of ring apertures similar to ring apertures 702 arranged in a two-dimensional array (e.g., for an VCSEL array). In general, ring apertures may be arranged in various one or two-dimensional array or tile patterns. The shapes in FIG. 7 are only illustrative examples, and other ring or curve shapes are contemplated in this disclosure. For example, A VCSEL may include several concentric ring apertures. In some implementations, the central circular aperture may not be present. In some implementations, the apertures may be ellipsoid in shape rather than ring-shaped. In general, apertures that have a curved shaped (defined further herein) may be used in the present disclosure.

Figure 8:
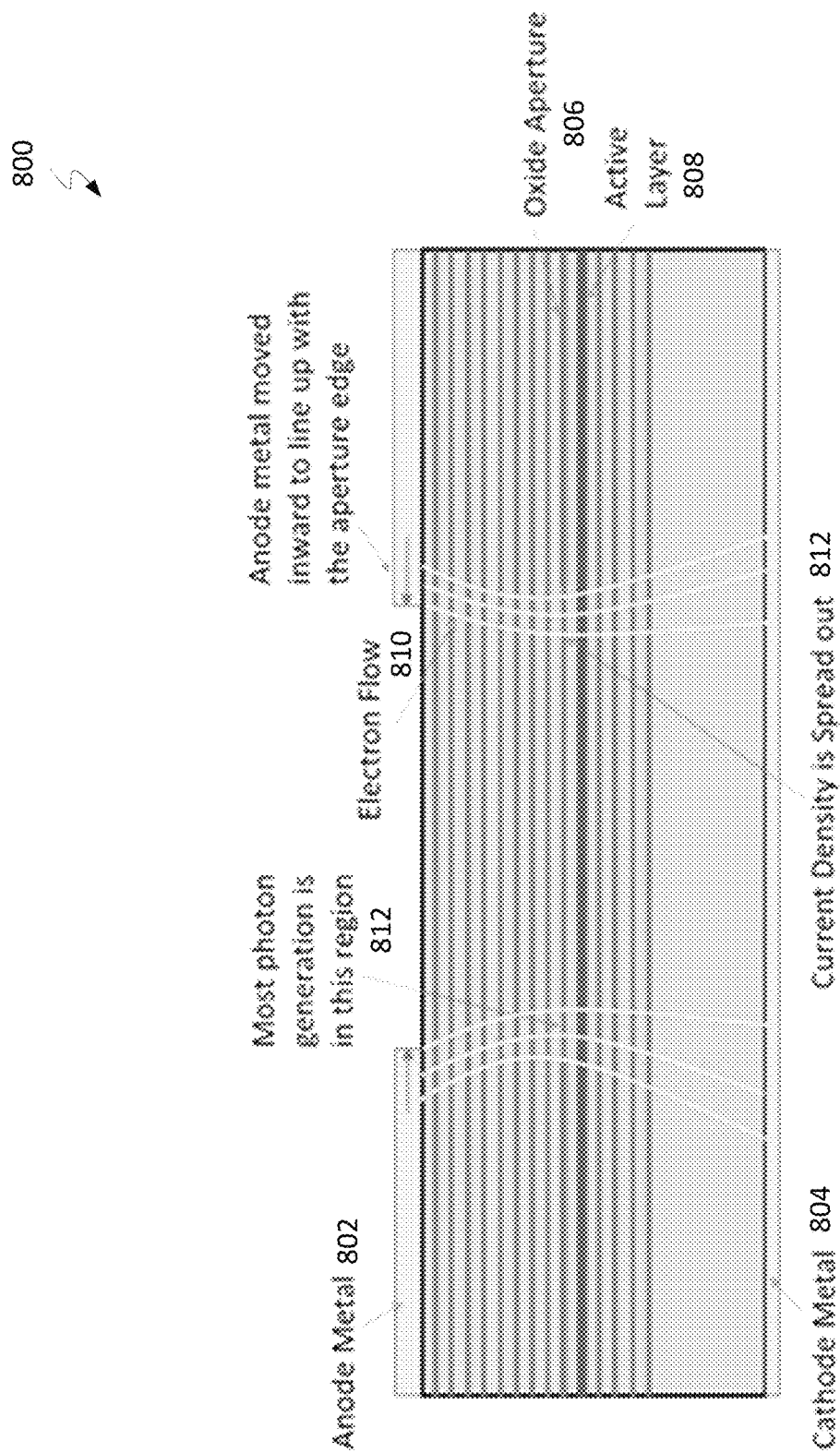
FIG. 8 a profile view of a VCSEL having a ring aperture operating at high current in accordance with various implementations.

FIG. 8 is a profile view of a VCSEL 800 having a ring aperture operating at high current in accordance with various implementations. The VCSEL 800 includes an upper anode metal layer 802 and a lower cathode metal layer 804. In between the anode and cathode layers 802, 804 are a ring-shaped oxide aperture 806 and an active layer 808. Electrons flow between the anode 802 and the cathode 804 along flow path 810 that crosses the aperture edges. Further improvements may be made to the VCSEL to further decrease the amount of heat generated at the aperture edges 812. In FIG. 8, the edges of the anode layer 802 may be extended to line up with the aperture edges 812. This increases the volume of the most efficient current pathway and thus spreads out the current density at the aperture edges 812 compared to VCSEL 300 in FIG. 3, in which the gap in the anode layer 802 is wider than the aperture.

Figure 9A:
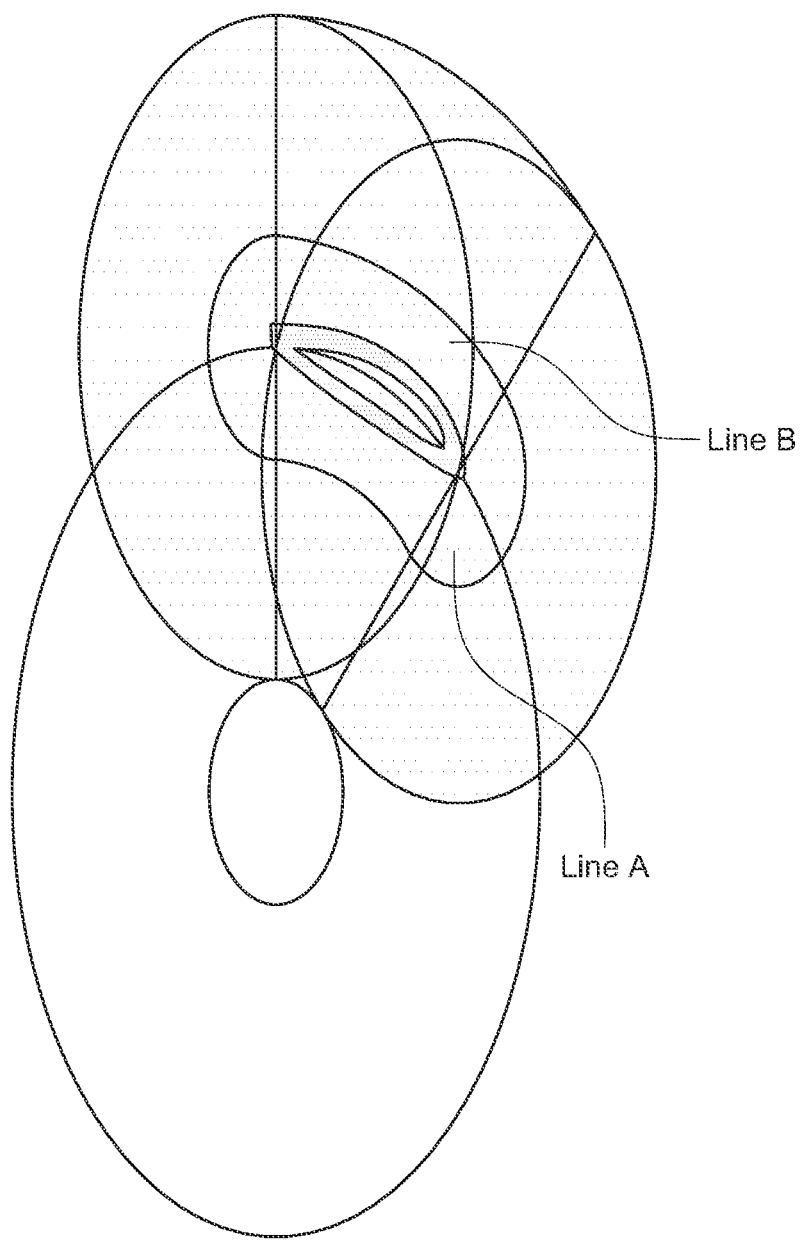
FIGS. 9A-C are diagrams representing different definitions of curvedness with respect to VCSEL apertures in accordance with various implementations.
Figure 9B:
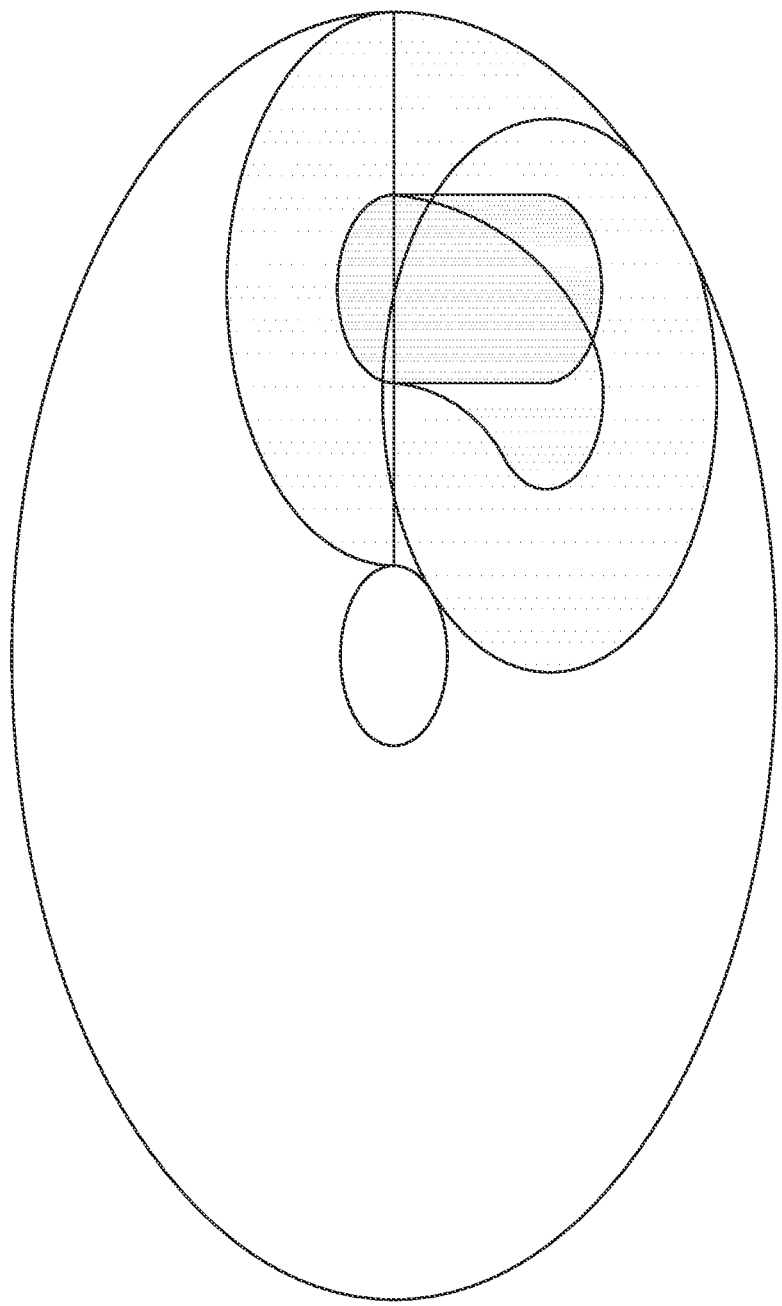
Figure 9C:
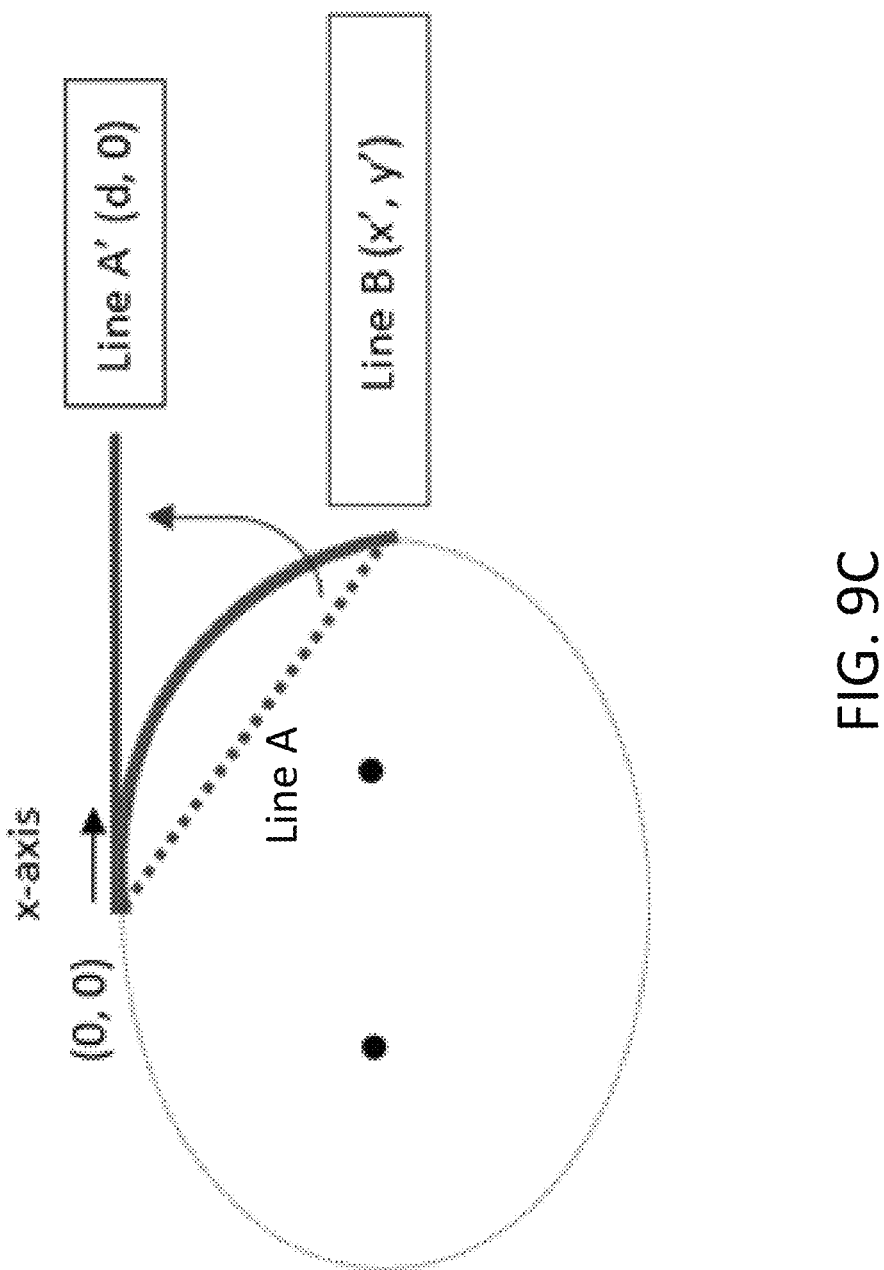

While the examples in FIGS. 4, 7, and 8 show ring-shaped apertures, the implementations disclosed herein are not limited to ring shapes in particular, but may encompass a number of different curved aperture shapes. The concept of "curvedness" of apertures with respect to this disclosure may be defined in a number of ways. FIGS. 9A-C are diagrams representing different definitions of curvedness with respect to VCSEL apertures in accordance with various implementations.

For example, in a first definition as shown in FIG. 9A, an aperture may be considered curved if it follows the arc length of a two-dimensional conic section, and a center line of the aperture (line B in FIG. 9A) deviates in length by >30% from a tangent line (line A) placed at one end point of the aperture. Specifically, line B in FIG. 9C is an arc length of a two-dimensional conic section in which the long axis of the conic section is parallel to the x-axis and coordinate (0, 0) is one end point of Line B. Line A is a vector connecting the end points of Line B in a linear path with length d=

$\sqrt{x'^2+y'^2}$. Line A' is Line A rotated around (0, 0) to be parallel with the x-axis (i.e., the end point of Line A' is (d, 0). The distance between the non-zero end points of Line A' and Line B is $C=\sqrt{(d-x')^2+y'^2}$. Then, if $(d-C)/d \leq 0.7$, then the aperture may be considered curved. The necessary degree of curvature may depend upon the width of the aperture. For example, if the width of the aperture is on the order of 4 micrometers (μm), then an arc-length which satisfies this definition is greater than 45 degrees for a circular 2D conic section. In another example, if the width of the aperture is on the order of 10 μm, then an arc-length which satisfies this definition would be greater than 30 degrees for a circular 2D conic section.

In a second definition as shown in FIG. 9B, an aperture may be considered curved if the curved area of the aperture (the curved shaded area in FIG. 9B) deviates by >30% in area from a linear stripe aperture (the straight shaded area) with the same area and center point. In a third definition, an aperture may be considered curved if the aperture shape has sufficient curvature to influence the far-field light output through mode selection.

If the shape of the aperture satisfies any of the above three definitions, then the aperture may be considered curved for the purposes of this disclosure. Any such curved aperture may be beneficial for high current, low pulse width VCSEL applications because of a longer aperture edge (hence better heat dissipation) and improved Gaussian beam distribution.

OTHER CONSIDERATIONS

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

The foregoing description of the implementations of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

What is claimed is:

1. A vertical cavity surface emitting laser (VCSEL) device, comprising:
    an anode;
    a cathode;
    one or more curved light-emitting apertures located in an epitaxial layer between the anode and the cathode, each of the one or more curved apertures having an aperture edge;
    one or more oxidation bridges crossing the curved aperture that allow current to flow inside the curved aperture; and
    one or more oxidation regions separating the apertures;
    wherein when a current signal is applied to the VCSEL, current flow between the anode and the cathode is distributed along the aperture edge of the one or more curved apertures.

2. The device of claim 1, wherein the one or more curved apertures are ring shaped.

3. The device of claim 2, wherein the one or more curved apertures comprise two or more concentric rings.

4. The device of claim 1, further comprising a circular aperture inside the one or more curved apertures.

5. The device of claim 1, wherein an edge of the anode overlaps with the aperture edge of the one or more curved apertures.

6. The device of claim 1, wherein the one or more curved apertures are partial arc lengths of a two-dimensional conic section.

7. The device of claim 6, wherein a center line of the one or more curved apertures deviates by at least 30% from a tangent line placed at an end point of the center line.

8. The device of claim 1, wherein a curved area of the one or more curved apertures deviates by at least 30% from a linear aperture having a same area and center point.

9. The device of claim 1, wherein the one or more curved apertures has a curvature above a threshold such that the curvature affects a far-field light output of the VCSEL device via mode selection.

10. The device of claim 1, wherein the one or more curved apertures are defined by an oxide layer in the epitaxial layer.

11. The device of claim 1, wherein the one or more curved apertures are fabricated by ion implantation in the epitaxial layer.

12. The device of claim 1, wherein the current signal is a high current, low pulse width current.

13. The device of claim 12, wherein the current signal is at least 50 milli-Amps and has a pulse width less than 100 nanoseconds.

14. A vertical cavity surface emitting laser (VCSEL) array, comprising:
    a plurality of VCSELs arranged in a two-dimension array, wherein each of the plurality of VCSELs is as described in claim 1.

15. The device of claim 1, further comprising a round aperture spaced from the one or more curved apertures.

16. The device of claim 15, wherein the round aperture is centered relative the one or more curved apertures.

17. The device of claim 15, further comprising a trench surrounding the VCSEL.

* * * * *